US011764913B2

(12) United States Patent
Ranganathan et al.

(10) Patent No.: US 11,764,913 B2
(45) Date of Patent: Sep. 19, 2023

(54) JITTER SELF-TEST USING TIMESTAMPS

(71) Applicant: Skyworks Solutions, Inc., Irvine, CA (US)

(72) Inventors: Raghunandan K. Ranganathan, Austin, TX (US); Kannanthodath V. Jayakumar, Austin, TX (US); Srisai R. Seethamraju, Nashua, NH (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/567,296

(22) Filed: Jan. 3, 2022

(65) Prior Publication Data

US 2022/0123877 A1 Apr. 21, 2022

Related U.S. Application Data

(63) Continuation of application No. 16/707,401, filed on Dec. 9, 2019, now Pat. No. 11,228,403.

(51) Int. Cl.
*H04L 1/20* (2006.01)
*G01R 31/30* (2006.01)
(Continued)

(52) U.S. Cl.
CPC ............ *H04L 1/205* (2013.01); *G01R 29/26* (2013.01); *G01R 31/3016* (2013.01); *G01R 31/31709* (2013.01); *G01R 31/31725* (2013.01)

(58) Field of Classification Search
CPC ..... H04L 1/205; G01R 29/26; G01R 31/3016; G01R 31/31709; G01R 31/31725
(Continued)

(56) References Cited

U.S. PATENT DOCUMENTS 7,439,724 B2 10/2008 Heidel et al.
8,283,933 B2 10/2012 Dasnurkar
(Continued)

FOREIGN PATENT DOCUMENTS

EP 0889411 B1 6/2003

OTHER PUBLICATIONS

Integrated Device Techology, Inc., "Jitter Specifications for Timing Signals," AN-840, Revision A, May 7, 2014, pp. 1-17.
(Continued)

*Primary Examiner* — Wednel Cadeau
(74) *Attorney, Agent, or Firm* — Knobbe, Martens, Olson & Bear, LLP

(57) ABSTRACT

A method for estimating jitter of a clock-signal-under-test includes generating a phase-adjusted clock signal based on an input clock signal and a feedback clock signal using a frequency-divided clock signal. The method includes generating N digital time codes for each phase adjustment of P phase adjustments of the phase-adjusted clock signal using a reference clock signal. Each digital time code of the N digital time codes corresponds to a first edge of a clock signal based on the phase-adjusted clock signal. P is a first integer greater than zero and N is a second integer greater than zero. The method includes generating a jitter estimate using an estimated standard deviation of a distribution of edges of the clock signal based on the N digital time codes for each of the P phase adjustments.

16 Claims, 5 Drawing Sheets

(51) Int. Cl.
*G01R 29/26* (2006.01)
*G01R 31/317* (2006.01)

(58) Field of Classification Search
USPC .......................................................... 375/226
See application file for complete search history.

(56) References Cited

U.S. PATENT DOCUMENTS

| | | |
|---|---|---|
| 9,804,573 B1 | 10/2017 | Drost et al. |
| 10,067,478 B1 | 9/2018 | Ranganathan |
| 10,243,671 B1 * | 3/2019 | Aouini .................... H03L 7/087 |
| 11,228,403 B2 | 1/2022 | Ranganathan et al. |
| 2007/0126513 A1 * | 6/2007 | Lee .................. G01R 31/31727 |
| | | 331/16 |
| 2009/0074124 A1 * | 3/2009 | Henzler ........... G01R 31/31709 |
| | | 375/371 |
| 2019/0007055 A1 | 1/2019 | Nelson |

OTHER PUBLICATIONS

Lee, J., "A Bist Circuit for Random Jitter Measurement," Dissertation, Department of Electrical and Computer Engineering, University of Texas at Austin, May 2012, 173 pages.

Liang, J., et al., "On-Chip Measurement of Clock and Data Jitter with Sub-Picosecond Accuracy for 10 GB/s Multilane DDRs," IEEE Journal of Solid-State Circuits, vol. 50, No. 4, Apr. 2015, 845-855.

\* cited by examiner

JITTER SELF-TEST USING TIMESTAMPS

CROSS-REFERENCE TO RELATED APPLICATION(S)

This application is a continuation of U.S. patent application Ser. No. 16/707,401, filed Dec. 9, 2019, entitled "Jitter Self-Test Using Timestamps" naming Raghunandan K. Ranganathan, Kannanthodath V. Jayakumar, and Srisai R. Seethamraju as inventors, which application is incorporated herein by reference in its entirety.

BACKGROUND

Field of the Invention

This disclosure is related to integrated circuits and more particularly to clock generator integrated circuits.

Description of the Related Art

In general, jitter is unwanted deviation from true periodicity of a presumably periodic signal, e.g., a clock signal. Random jitter is caused by thermal noise in electrical circuits and is unpredictable, may be the composite of many uncorrelated noise sources, and typically follows a normal distribution. The amount of tolerable jitter varies with the target application. In an exemplary application, e.g., clock and data recovery circuits for digital communications, jitter of a sampling clock signal determines the performance of the digital communications system and as the frequency of the sampling clock signal increases, tolerance for jitter decreases. High performance phase-locked loops are used in clock generators as jitter attenuators to achieve a sampling clock signal with jitter of less than 100 femto-seconds root-mean-square (RMS) over 12 kHz to 20 MHz. However, individual integrated circuits vary and production testing is used to identify any integrated circuit products with jitter that exceeds a target specification.

Referring to FIG. 1, a conventional test for screening integrated circuit devices for satisfying target jitter specifications uses phase noise analyzer 104 to evaluate each integrated circuit product 100. Integrated circuit product 100 includes clock generator 102 that attenuates jitter of input clock signal CLK_IN and provides the resulting clock signal as output clock signal CLK_OUT. Phase noise analyzer 104 uses reference clock signal CLK_REF to test each integrated circuit product 100 to determine whether output clock signal CLK_OUT satisfies a jitter specification for a target application. Suitable phase noise analyzers are expensive and require a substantial amount of time to test each integrated circuit device (e.g., approximately ten seconds per integrated circuit device). Accordingly, improved techniques for testing integrated circuit devices are desired.

SUMMARY OF EMBODIMENTS OF THE INVENTION

In at least one embodiment, a method for estimating jitter of a clock-signal-under-test includes generating a phase-adjusted clock signal based on an input clock signal and a feedback clock signal using a frequency-divided clock signal. The method includes generating N digital time codes for each phase adjustment of P phase adjustments of the phase-adjusted clock signal using a reference clock signal. Each digital time code of the N digital time codes corresponds to a first edge of a clock signal based on the phase-adjusted clock signal. P is a first integer greater than zero and N is a second integer greater than zero. The method includes generating a jitter estimate using an estimated standard deviation of a distribution of edges of the clock signal based on the N digital time codes for each of the P phase adjustments.

In at least one embodiment an integrated circuit for estimating jitter of a clock signal includes a clock generator circuit configured to generate a phase-adjusted clock signal based on an input clock signal and a feedback clock signal. The integrated circuit includes a time-to-digital converter circuit configured to generate digital time codes corresponding to first edges of the clock signal using a reference clock signal. The integrated circuit includes a control circuit configured to cause the time-to-digital converter circuit to generate N digital time codes for each phase adjustment of P phase adjustments applied to the clock generator circuit. P is a first integer greater than zero and N is a second integer greater than zero. The integrated circuit includes a logic circuit configured to generate a jitter indicator based on an expected period of the clock signal and a jitter estimate generated using a standard deviation of a distribution of edges of the clock signal based on the N digital time codes for each of the P phase adjustments.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
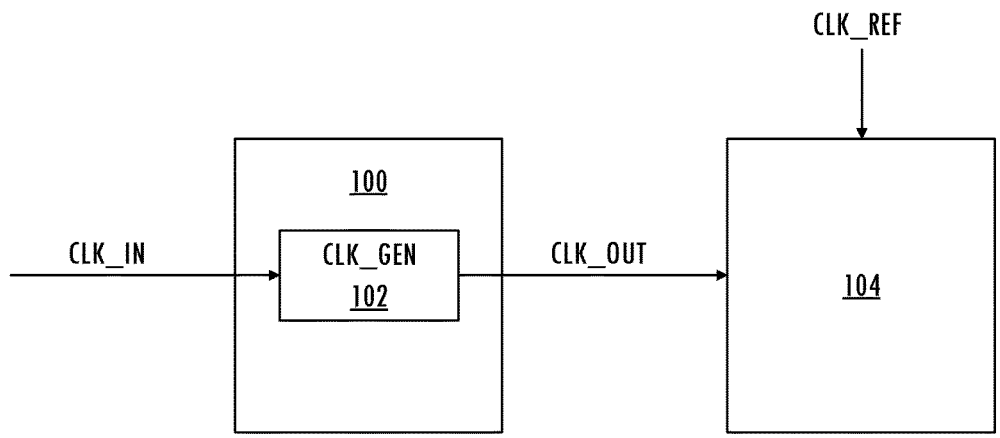
FIG. 1 illustrates an exemplary technique for evaluating jitter of a clock signal generated by an integrated circuit product.
Figure 2:
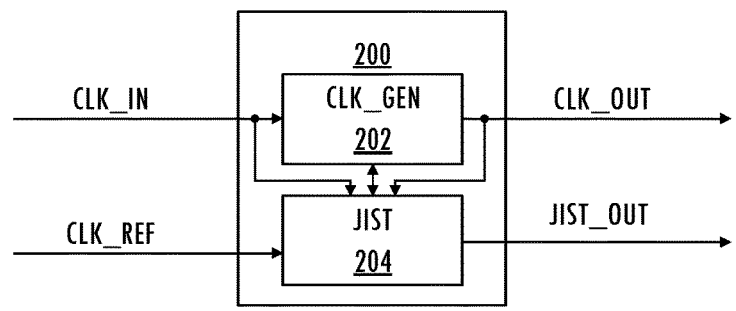
FIG. 2 illustrates an exemplary integrated circuit product including a clock generator and a jitter self-test circuit consistent with at least one embodiment of the invention.

A jitter self-testing technique uses circuits included in an integrated circuit product to estimate jitter of a clock signal of the integrated circuit product. The technique provides high-resolution jitter estimates (e.g., jitter estimates in ranges less than one picosecond) using negligible testing time (e.g., 100 ms for a 10 MHz clock signal) and reduces or eliminates the need for expensive testing equipment. Referring to FIG. 2, in at least one embodiment, integrated circuit product 200 includes clock generator circuit 202 and jitter self-test circuit 204. Jitter self-test circuit 204 uses reference clock signal CLK_REF that is assumed to be ideal to measure cycle-to-cycle jitter ($T_{J,C2C}$) of a clock-signal-under-test (e.g., input clock signal CLK_IN, output clock signal CLK_OUT, or other clock signal internal to clock generator circuit 202). Assuming the jitter has a Gaussian distribution, the cycle-to-cycle jitter can be used to estimate the RMS jitter in a frequency band of interest ($T_{J,RMS}$), which is a specification used in data communications applications. For example, since cycle-to-cycle jitter is proportional to RMS jitter, jitter self-test circuit 204 determines cycle-to-cycle jitter and uses the cycle-to-cycle jitter to provide an indication of the RMS jitter in a frequency band of interest.

Figure 3:
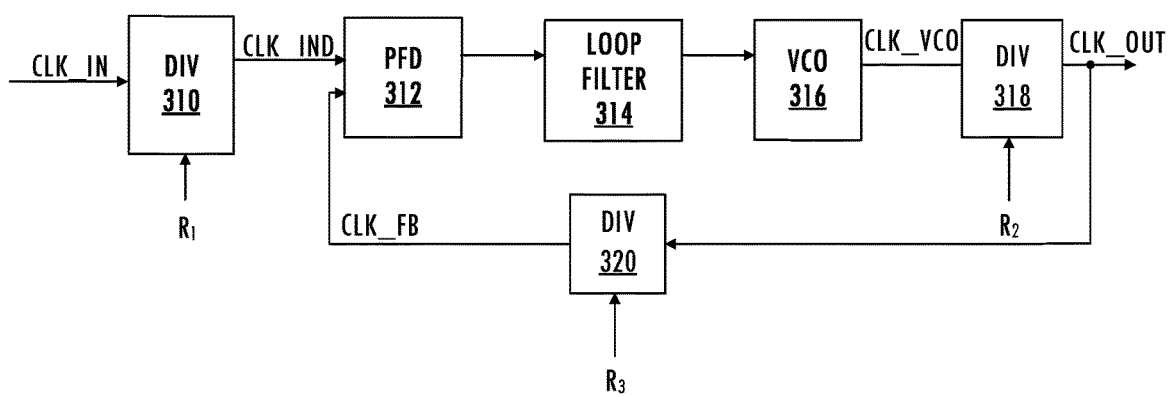
FIG. 3 illustrates an exemplary clock generator circuit.

FIG. 3 illustrates an embodiment of clock generation circuit 202 that includes an analog phase-locked loop and frequency dividers 310, 318, or 320. Frequency dividers 310, 318, or 320 are integer dividers or fractional dividers. Frequency divider 310 generates an input clock signal CLK_IND based on clock signal CLK_IN and divide ratio $R_1$, frequency divider 320 generates feedback clock signal CLK_FB based on output clock signal CLK_OUT and divide ratio $R_3$, and frequency divider 318 generates output clock signal CLK_OUT based on clock signal CLK_IN and divide ratio $R_1$. Divide ratios $R_1$, $R_2$, and $R_3$ are predetermined to generate corresponding clock signals at target frequencies according to a target application and frequency plan. The analog phase-locked loop uses phase/frequency detector 312, loop filter 314, and voltage-controlled oscillator 316 to generate clock signal CLK_OUT. In some embodiments, one or more of frequency dividers 310, 318, and 320 are excluded.

Figure 4:
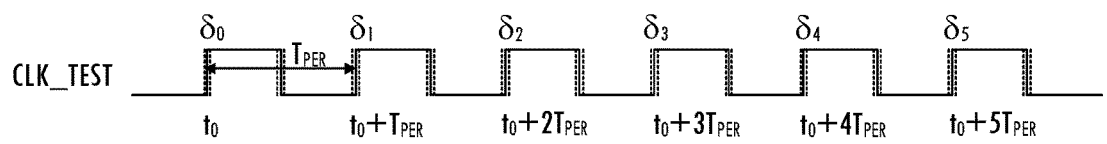
FIG. 4 illustrates an exemplary waveform for a clock-signal-under-test.
Figure 5:
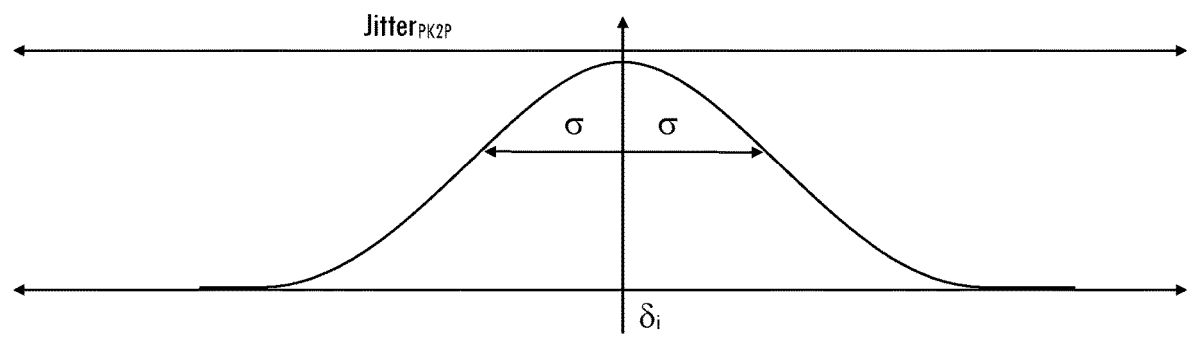
FIG. 5 illustrates an exemplary estimated probability distribution for jitter of an edge of a clock-signal-under-test.

Referring to FIGS. 2, 4, and 5, jitter self-test circuit 204 estimates jitter or associated statistics, for clock-signal-under-test CLK_TEST using reference clock signal CLK_REF that is assumed to be ideal. The waveform for clock-signal-under-test CLK_TEST illustrates jitter $\delta_i$ on the $i^{th}$ edge of clock-signal-under-test CLK_TEST having period $T_{PER}$. Time to is the time at the beginning of observation of clock-signal-under-test CLK_TEST. Assuming that the jitter distribution is Gaussian, jitter self-test circuit 204 estimates the RMS jitter in a frequency band of interest by calculating the standard deviation (a) of a distribution of edges of the clock-signal-under-test while sweeping a phase of the clock-signal-under-test from 0 to a maximum phase:

$$\sigma = \sqrt{\frac{\sum_{i=1}^{N}(x_i - \bar{x})^2}{N-1}},$$

where $x_i$ is a digital code corresponding to the observed occurrence of the $i^{th}$ clock edge and $\bar{x}$ is the expected value of the occurrence of the clock edge and N is the number of occurrences. The RMS jitter is approximately σ and the peak-to-peak jitter is approximately 14σ.

Figure 6:
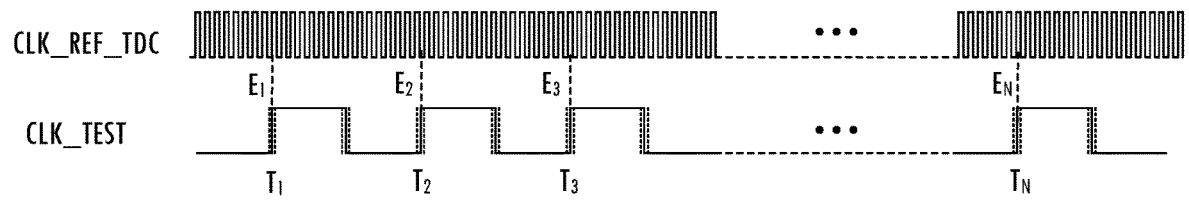
FIG. 6 illustrates exemplary waveforms for a reference clock signal and a clock-signal-under-test of an integrated circuit product.

Referring to FIGS. 2 and 6, jitter self-test circuit 204 includes a time-to-digital converter circuit (e.g., a time-stamper circuit) that converts a time of occurrence of an event (e.g., occurrence of a positive or a negative edge of a clock signal) into a digital code with respect to a reference time signal. For example, a time-to-digital converter circuit generates digital codes $T_1, T_2, T_3, \ldots, T_N$ for each rising edge of clock-signal-under-test CLK_TEST with respect to reference clock signal CLK_REF_TDC. Each digital code corresponds to a number of cycles of reference clock signal CLK_REF that have occurred since the beginning of an observation interval at the time of occurrence of a corresponding rising edge $E_1, E_2, E_3, \ldots, E_N$ of clock-signal-under-test CLK_TEST. The resolution of the time-to-digital converter determines the accuracy of the timestamps. The first difference of the digital codes (e.g., $T_{i+1} - T_i$) can be used to estimate the cycle-to-cycle jitter ($T_{J,C2C}$) of clock-signal-under-test CLK_TEST.

Figure 7:
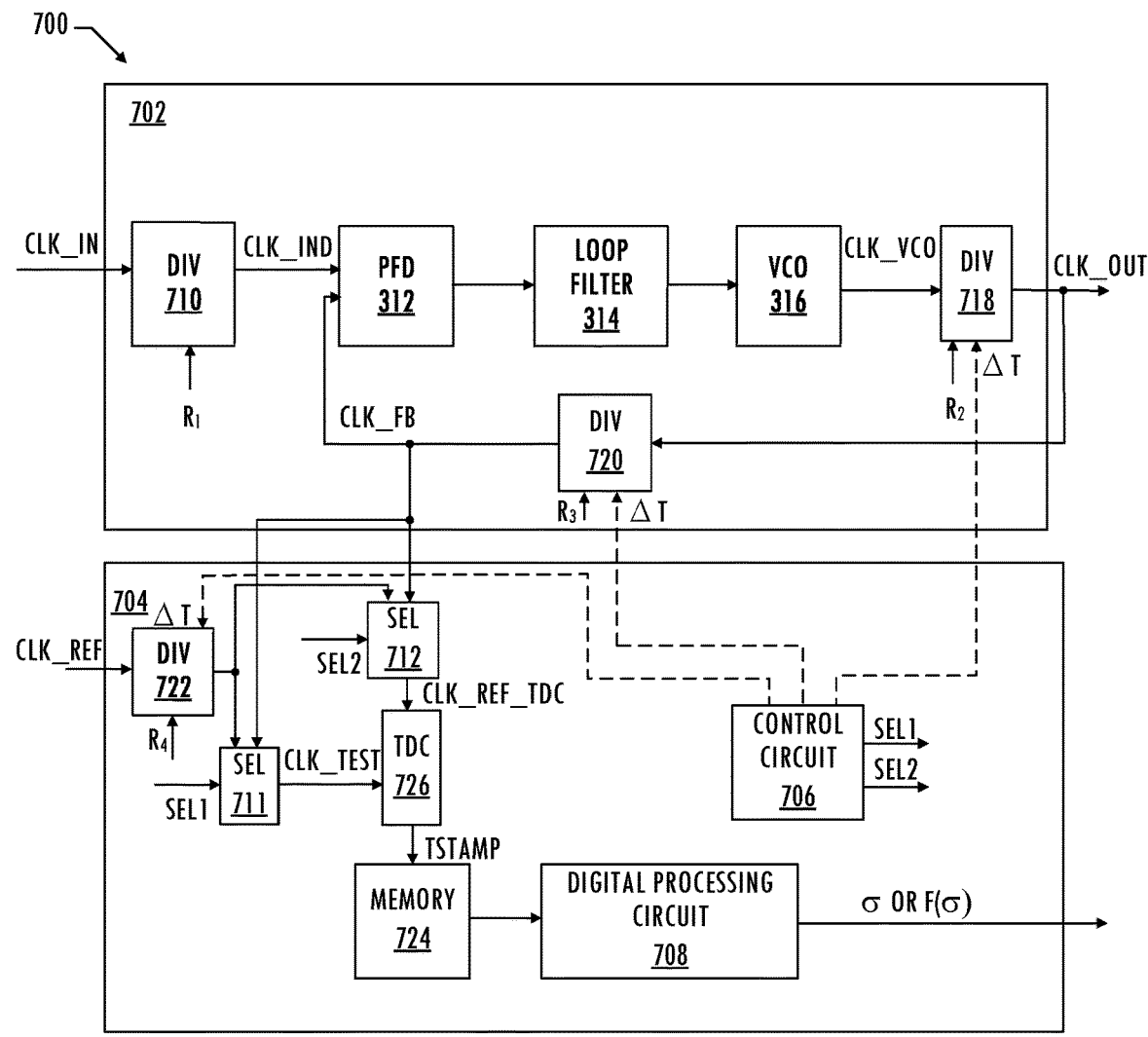
FIG. 7 illustrates an exemplary clock generation circuit and jitter self-testing circuit consistent with at least one embodiment of the invention.

By introducing a phase adjustment, incrementing the phase adjustment P times, and generating a statistically significant number N of digital codes for each phase adjustment of the P phase adjustments, jitter self-test circuit 204 estimates the RMS jitter of a clock-signal-under-test. Referring to FIG. 7, in at least one embodiment of integrated circuit product 700, clock generator 702 includes an analog phase-locked loop, as described above, and at least one of frequency divider 710, 718, and 720 that is capable of introducing a phase adjustment (e.g., incrementing a phase adjustment by an amount ΔT) indicated by a control signal received from control circuit 706. For example, jitter self-test circuit 704 increments a phase adjustment by 100 femto-second steps for ten picoseconds or increments the phase adjustment in ten femto-second steps for one picosecond. At least one of frequency divider 710, 718, and 720 receives a digital code corresponding to that phase adjustment the adjusted value is used for N measurements. Jitter self-test circuit 704 includes time-to-digital converter 726. In at least one embodiment time-to-digital converter 726 generates digital code TSTAMP by capturing a counter value coincident with a rising edge of clock-signal-under-test CLK_TEST. The counter of time-to-digital converter 726 updates in response to a reference clock signal CLK_REF_TDC having a high frequency (i.e., a frequency one or more orders of magnitude higher than the frequency of clock-signal-under-test CLK_TEST). In at least one embodiment of jitter self-test circuit 704, time-to-digital converter 726 is implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference. In at least one embodiment of jitter self-test circuit 704, time-to-digital converter 726 is implemented using techniques described in U.S. Pat. No. 9,804,573, issued Oct. 31, 2017, entitled "Use of Redundancy in Sub-Ranging Time-to-Digital Converters to Eliminate Offset Mismatch Issues," naming Brian G. Drost and Ankur G. Roy as inventors, which application is incorporated herein by reference. However, other time-to-digital converters may be used.

In at least one embodiment of jitter self-test circuit 704, select circuits 711 and 712 provide flexibility to operate jitter self-test circuit 704 in various modes to test different clock signals of integrated circuit product 700. For example, jitter self-test circuit 704 is selectively configurable in a first mode with clock signal CLK_FB as the clock-signal-under-test CLK_TEST and reference clock signal CLK_REF as the reference clock signal CLK_REF_TDC. Jitter self-test circuit 704 is selectively configurable in a second mode with reference clock signal CLK_REF as the clock-signal-under-test CLK_TEST and clock signal CLK_FB as reference clock signal CLK_REF_TDC. The first mode assumes that reference clock signal CLK_REF is an ideal clock signal to estimate jitter of a clock signal (e.g., clock signal CLK_FB) derived from clock signal CLK_VCO by clock generator 702. The second mode uses a clock derived from clocks signal CLK_VCO as reference clock signal CLK_REF_TDC to estimate jitter on reference clock signal CLK_REF received by integrated circuit product 700. In other embodiments of jitter self-test circuit 704, time-to-digital converter 726 is directly coupled to receive clock signal CLK_IN as the clock-signal-under-test and use clock signal CLK_FB as reference clock signal CLK_REF_TDC.

Figure 8:
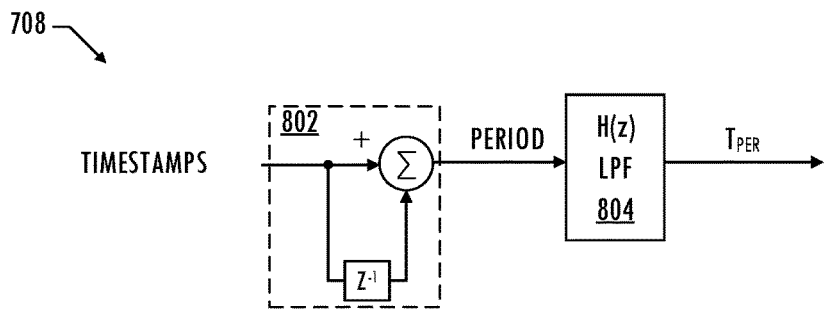
FIG. 8 illustrates an exemplary expected frequency estimation circuit consistent with at least one embodiment of the invention.

In at least one embodiment, control circuit 706 sweeps the phase by causing frequency divider 718, frequency divider 720, or frequency divider 722 to apply phase adjustment ΔT. Memory 724 stores a stream of digital time codes for use by digital processing circuit 708. Digital processing circuit 708 includes circuitry that estimates mean period information $T_{PER}$. In at least one embodiment, a moving average filter estimates mean period information $T_{PER}$, as illustrated in FIG. 8. Circuit 802 generates a first difference of the digital time codes that provides instantaneous period information and filtering circuit 804 estimates mean period information $T_{PER}$. A higher order moving average filter may be used to improve noise attenuation. An exemplary transfer function for the moving average filter is $$H_{lp} = \text{Gain} \times \left[ \frac{1 - z^{-N}}{1 - z^{-1}} \right]^M,$$

where N is the number of points being averaged and M is the order of the moving average filter. In at least one embodiment, the averaging length is programmable. In some embodiments, rather than determine mean period information, a mean period value $T_{PER}$ can be received from a user and stored in memory 724. Digital processing circuit 708 includes custom circuits or a digital signal processor that executes instructions stored in memory 724 to determine mean period value $T_{PER}$ and estimate the standard deviation (σ) of the distribution of clock edges based on N digital time codes for each phase adjustment of P phase adjustments. For example, digital processing circuit 708 associates each of the N digital time codes with a first set of digital time codes or a second set of digital codes by comparing, for each phase adjustment of P phase adjustments, each digital time code Ti of the N digital time codes to an initial digital time code $T_0$. If the difference between two successive digital time codes is less than or equal to the estimated period, i.e., $T_i = T_0 + i \times T_{PER}$, then the digital code is associated with the first set. Alternately, if the difference between two successive digital time codes is greater than to the estimated period, i.e., $T_i \neq T_0 + i \times T_{PER}$, then the digital code is associated with the second set. Digital processing circuit 708 provides the standard deviation of the first or second set of digital time codes or a function of the standard deviation of the first or second set of digital time codes to a terminal of integrated circuit product 700 or stores the standard deviation or function of the standard deviation for later access by a user.

Figure 9:
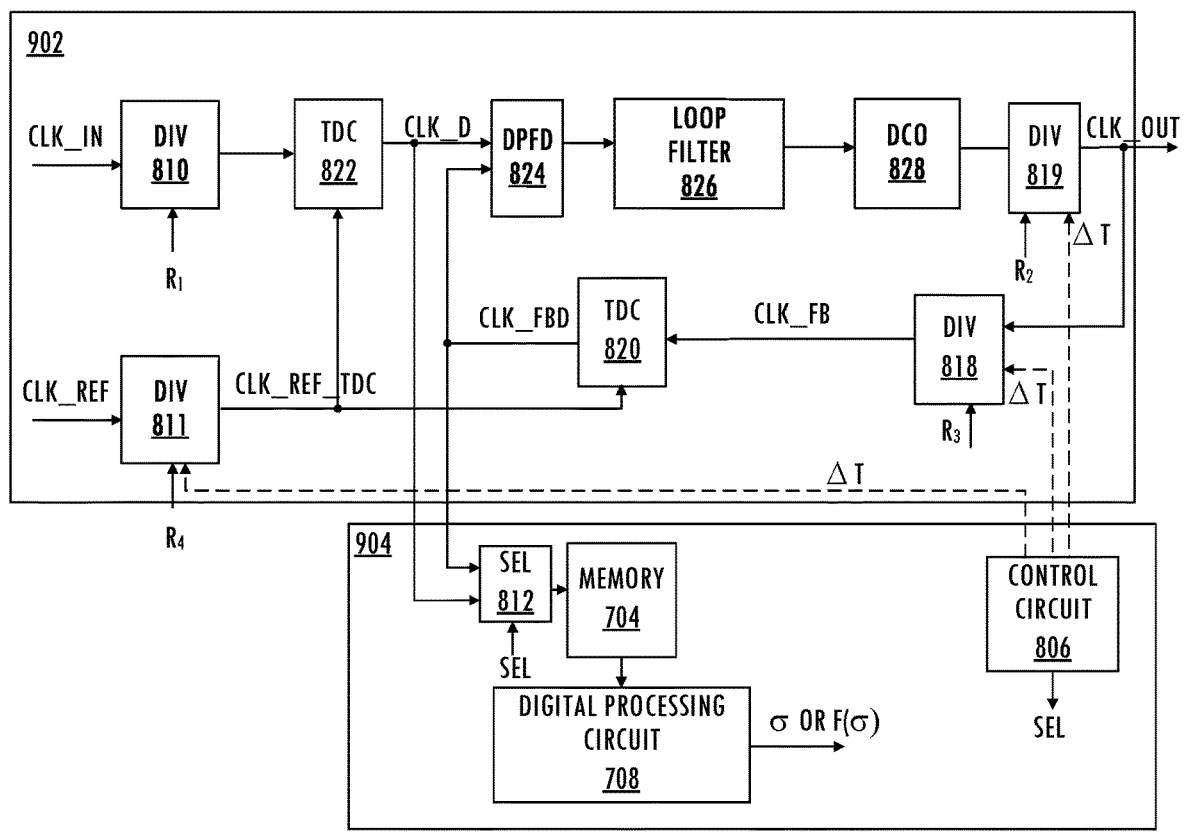
FIG. 9 illustrates an exemplary jitter self-testing circuit and clock generation circuit including a digital phase/frequency detector and a digitally controlled oscillator consistent with at least one embodiment of the invention.

Referring to FIG. 9, in at least one embodiment of integrated circuit product 900, clock generator 902 uses digital phase frequency detector 824, digital loop filter 826, and digitally controlled oscillator 828. Accordingly, clock generator 902 includes time-to-digital converters 822 and 820, which are used by jitter self-test circuit 904. Control circuit 806 configures select circuit 812 to provide output digital time codes generated by one of those time-to-digital converters for storage in memory 724. In other embodiments, select circuit 812 is omitted and the output digital time codes generated by time-to-digital converter 822 or the output digital time codes generated by time-to-digital converter 820 are stored in memory 724 and processed by digital processing circuit 708 to generate an indication of jitter of the corresponding clock-signal-under-test. Input divider 811, feedback divider 818, or output divider 819 is capable of phase adjustment by an amount ΔT indicated by a control signal received from control circuit 806. However, in other embodiments, the phase adjustment is applied by frequency divider 810 or other circuit of clock generator 902.

Figure 10:
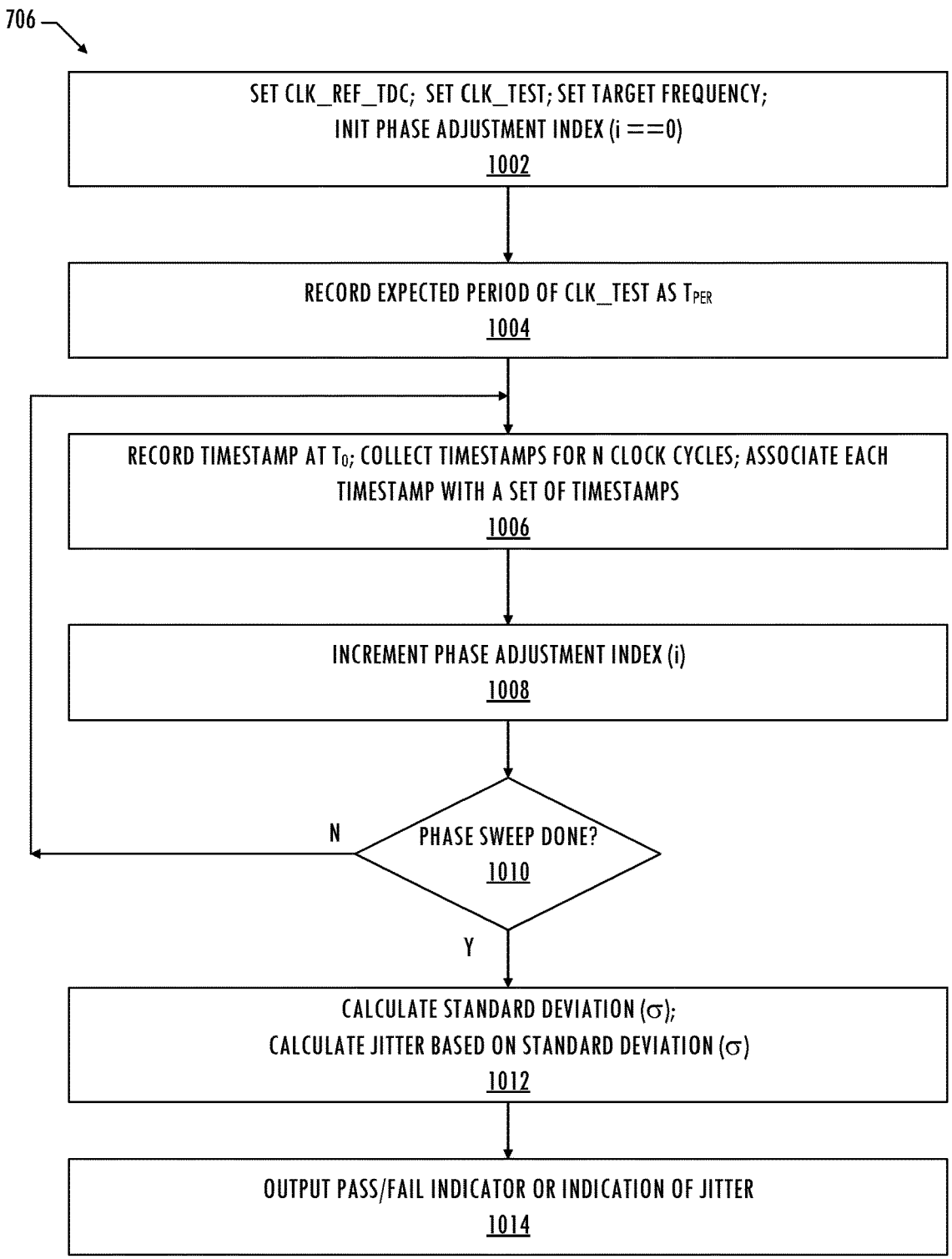
FIG. 10 illustrates exemplary information and control flows for a jitter self-testing a clock generation circuit of an integrated circuit product consistent with at least one embodiment of the invention.

Referring to FIGS. 7 and 10, in at least one embodiment of jitter self-test circuit 704, control circuit 706 configures clock generator 702 for jitter self-test (1002). For example, control circuit 706 sets a target frequency for clock-signal-under-test CLK_TEST by providing divider values $R_1$, $R_2$, and $R_3$ to frequency divider 710, frequency divider 718, and frequency divider 720, respectively. Control circuit 706 generates control signals SEL1 and SEL2 for select circuits 711 and 712 to configure time-to-digital converter 726 in a first mode using a presumably ideal clock signal as reference clock signal CLK_REF_TDC to generate timestamps for clock-signal-under-test CLK_TEST (e.g., a clock derived from the output of voltage-controlled oscillator 316) or in a second mode using a clock derived from the output of voltage controlled oscillator 316 (e.g., clock signal CLK_VCO or clock signal CLK_OUT) to estimate jitter of an input clock signal CLK_REF, which is frequency divided by frequency divider 722 using divider value $R_4$. In addition, control circuit 706 initializes a phase adjustment (e.g., sets index i equal to zero). Control circuit 706 stores a first timestamp of an observation interval to memory 724 and stores an expected period of clock-signal-under-test CLK_TEST as mean period information $T_{PER}$ (e.g., estimated using digital processing circuit 708) in memory 724 (1004).

Jitter self-test circuit 704 captures timestamps generated by time-to-digital converter 726 for N cycles (e.g., 1000 cycles) of clock-signal-under-test CLK_TEST (1006). After capturing N timestamps, digital processing circuit 708 associates each timestamp with a first set of timestamps or a second set of timestamps by comparing each timestamp of the N timestamps to a value based on index i and the initial timestamp $T_0$. If $T_i = T_0 + i \times T_{PER}$, then the timestamp is associated with the first set. If $T_i \neq T_0 + i \times T_{PER}$, then digital processing circuit 708 associates the timestamp with the second set. Then, control circuit 706 increments the applied phase adjustment (e.g., adds another ΔT into clock generator) (1008) and determines whether a sweep of the phase has completed (e.g., clock generator 702 has received P phase adjustments). If the phase sweep has not completed (e.g., clock generator 702 has received fewer than P phase adjustments) (1010), then jitter self-test circuit 704 continues to capture timestamps in memory 724 and digital processing circuit 708 continues to sort timestamps into the first set of timestamps and the second set of timestamps based on edges of clock-signal-under-test CLK_TEST and reference clock signal CLK_REF_TDC (1006). If the phase sweep has completed (e.g., i==P or ΔT==max ΔT) (1010), then digital processing circuit 708 calculates the standard deviation of the distribution of timestamps in the first set of timestamps or the second set of timestamps (1012). Since the jitter is proportional to the standard deviation, digital processing circuit 708 provides the standard deviation or a value based on the standard deviation and as an indicator of jitter of the clock-signal-under test. Digital processing circuit 708 outputs the jitter estimate, the standard deviation estimate, or an indication of whether the jitter satisfies a predetermined specification external to the integrated circuit product (1014). Note that the information and control flow of FIG. 10 is exemplary only and variation in the sequence of events that preserve data dependencies may be used.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium. The tangible computer-readable media may store instructions as well as data that can be used to implement the invention. The instructions/data may be related to hardware, software, firmware or combinations thereof.

Thus, techniques for estimating jitter of a clock signal using a time-to-digital converter of an integrated circuit product are disclosed. The jitter self-test techniques are cheaper and faster than using a phase noise analyzer external to the integrated circuit product. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. A method for estimating jitter of a clock-signal-under-test, the method comprising:
   generating a phase-adjusted clock signal based on an input clock signal and a feedback clock signal using a frequency-divided clock signal;
   generating N digital time codes for each of P phase adjustments of the phase-adjusted clock signal using a reference clock signal, each of the N digital time codes corresponding to a first edge of a clock signal based on the phase-adjusted clock signal, P being a first integer greater than zero and N being a second integer greater than zero;
   generating a jitter estimate using an estimated standard deviation of a distribution of edges of the clock signal based on the N digital time codes for each of the P phase adjustments;
   for a $p^{th}$ phase adjustment of the P phase adjustments, associating an initial digital time code of the N digital time codes with a first set, and associating each other digital time code either with the first set if the other digital time code equals a sum of the initial digital time code and a product of p and an expected period of the clock signal, or else with a second set, where $0 \leq p \leq P$; and
   generating an estimated standard deviation based on the first set.

2. The method as recited in claim 1 further comprising sweeping a phase of the clock-signal-under-test from a first predetermined phase to a second predetermined phase using the P phase adjustments of the phase-adjusted clock signal.

3. The method as recited in claim 1 wherein the phase-adjusted clock signal is a frequency-divided output of a phase-locked loop, a frequency-divided feedback signal of the phase-locked loop, or frequency-divided input of the phase-locked loop.

4. The method as recited in claim 1 wherein generating the jitter estimate further comprises generating a variance based on digital time codes associated with the first set.

5. The method as recited in claim 1 further comprising estimating an expected period of the phase-adjusted clock signal and using an estimate of the expected period to generate the jitter estimate.

6. The method as recited in claim 1 wherein the input clock signal is the reference clock signal and the clock signal is an output of a voltage-controlled oscillator of a phase-locked loop.

7. The method as recited in claim 1 further comprising providing an indicator of the jitter estimate to a terminal of an integrated circuit.

8. An integrated circuit for estimating jitter of a clock signal, the integrated circuit comprising:
   a clock generator circuit configured to generate a phase-adjusted clock signal based on an input clock signal and a feedback clock signal;
   a time-to-digital converter circuit configured to generate digital time codes corresponding to first edges of the clock signal using a reference clock signal;
   a control circuit configured to cause the time-to-digital converter circuit to generate N digital time codes for each phase adjustment of P phase adjustments applied to the clock generator circuit, P being a first integer greater than zero and N being a second integer greater than zero; and
   a logic circuit configured to generate a jitter indicator based on an expected period of the clock signal and a jitter estimate generated using a standard deviation of a distribution of edges of the clock signal based on the N digital time codes for each of the P phase adjustments, and configured, for a $p^{th}$ phase adjustment of the P phase adjustments, to associate an initial digital time code of the N digital time codes with a first set, and to associate each other digital time code either with the first set if the other digital time code equals a sum of the initial digital time code and a product of p and the expected period, or else with a second set, where $0 \leq p \leq P$.

9. The integrated circuit as recited in claim 8 wherein the control circuit is further configured to sweep a phase of the clock signal from a first predetermined phase to a second predetermined phase using the P phase adjustments of the phase-adjusted clock signal.

10. The integrated circuit as recited in claim 8 wherein the clock generator circuit comprises a frequency divider circuit, each phase adjustment being applied by the frequency divider circuit, the frequency divider circuit being an output divider circuit of a phase-locked loop, a feedback divider circuit of the phase-locked loop, or an input divider circuit of the phase-locked loop.

11. The integrated circuit as recited in claim 8 further comprising a variance calculating circuit configured to generate a variance based on digital time codes associated with the first set, wherein the jitter indicator is based on the variance.

12. The integrated circuit as recited in claim 8 further comprising a frequency monitor circuit configured to generate the expected period of the phase-adjusted clock signal.

13. The integrated circuit as recited in claim 8 wherein the clock generator circuit comprises a phase-locked loop and the time-to-digital converter circuit is coupled to a feedback divider circuit of the phase-locked loop or an input divider circuit of the phase-locked loop.

14. The integrated circuit as recited in claim 8 wherein the input clock signal is the reference clock signal and the clock signal is an output of a voltage-controlled oscillator of the clock generator circuit.

15. The integrated circuit as recited in claim 8 wherein the reference clock signal is based on an output of a voltage-controlled oscillator of the clock generator circuit and the clock signal is the input clock signal.

16. The integrated circuit as recited in claim 8 further comprising a terminal of the integrated circuit configured to provide an indicator of the jitter estimate externally to the integrated circuit.

\* \* \* \* \*